US012603121B2

(12) United States Patent
Yuh

(10) Patent No.: US 12,603,121 B2
(45) Date of Patent: Apr. 14, 2026

(54) MEMORY REFRESH WITH NEGATIVE VOLTAGE GENERATOR

(71) Applicant: Taiwan Semiconductor Manufacturing Company, Ltd., Hsinchu (TW)

(72) Inventor: Perng-Fei Yuh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 89 days.

(21) Appl. No.: 18/451,988

(22) Filed: Aug. 18, 2023

(65) Prior Publication Data

US 2025/0061934 A1 Feb. 20, 2025

(51) Int. Cl.
*G11C 11/406* (2006.01)
*G11C 11/408* (2006.01)
*G11C 11/4099* (2006.01)

(52) U.S. Cl.
CPC .... *G11C 11/40615* (2013.01); *G11C 11/4085* (2013.01); *G11C 11/4099* (2013.01)

(58) Field of Classification Search
CPC .......... G11C 11/40615; G11C 11/4085; G11C 11/4099; G11C 11/401
See application file for complete search history.

(56) References Cited

U.S. PATENT DOCUMENTS

| | | | | | |
|---|---|---|---|---|---|
| 4,417,202 A | * | 11/1983 | Pascoe | ................... | G01R 31/52 |
| | | | | | 340/650 |
| 6,055,191 A | * | 4/2000 | Sher | ..................... | G11C 7/1057 |
| | | | | | 326/26 |

| | | | | | |
|---|---|---|---|---|---|
| 10,020,029 B1 | * | 7/2018 | Tan | ........................ | G11C 5/145 |
| 2001/0003513 A1 | * | 6/2001 | Shau | ......................... | G11C 7/18 |
| | | | | | 257/E27.092 |
| 2009/0180315 A1 | | 7/2009 | Yoon et al. | | |
| 2009/0251979 A1 | | 10/2009 | Chang | | |
| 2009/0316487 A1 | | 12/2009 | Lee et al. | | |
| 2021/0057009 A1 | | 2/2021 | Kim | | |
| 2022/0319616 A1 | | 10/2022 | Gajera et al. | | |

FOREIGN PATENT DOCUMENTS

| | | | | | |
|---|---|---|---|---|---|
| CN | 101154442 A | * | 4/2008 | .......... | G11C 11/412 |
| JP | 2005500636 A | * | 1/2005 | | |
| TW | 200943293 A | | 10/2009 | | |

OTHER PUBLICATIONS

JP-2005500636-A; Accurate Verification Apparatus And Method For NOR Flash Memory Cells In The Presence Of High Column Leakage (Year: 2005).*
CN 101154442 A; Static Random Access Memory Macro And Two-port Static Random Access Memory Device (Year: 2008).*

* cited by examiner

*Primary Examiner* — Sultana Begum
(74) *Attorney, Agent, or Firm* — Merchant & Gould P.C.

(57) ABSTRACT

Limiting a leakage current of a memory device is provided. A sensing current that is a representative of a leakage current of a memory cell array of a memory device is generated. A reference current having a preset value is generated. The sensing current is compared with the reference current. An enable signal is generated based on the comparison. A bias voltage applied to a plurality of word lines of the memory cell array is adjusted based on the enable signal.

20 Claims, 8 Drawing Sheets

MEMORY REFRESH WITH NEGATIVE VOLTAGE GENERATOR

BACKGROUND

Semiconductor memory are utilized extensively as a storage medium for digital devices such as personal computers, cellular telephones, personal data assistants, and other similar products. Digital information in the unit of one bit is stored in a two dimensional array of bit cells or memory cells. Typically, a memory device includes one or more memory arrays that include memory cells, and peripheral circuits for performing functions, such as addressing the memory cells, storing data in the memory cells, and retrieving data from the memory cells. The memory arrays can be any suitable type of memory, such as dynamic random-access memory (DRAM) or static random-access memory (SRAM). In SRAM, data is maintained as long as power is provided to it. On the other hand, DRAM is volatile, which means, it requires constant rewriting to maintain its content. DRAM is small and inexpensive and is thus used for most system memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
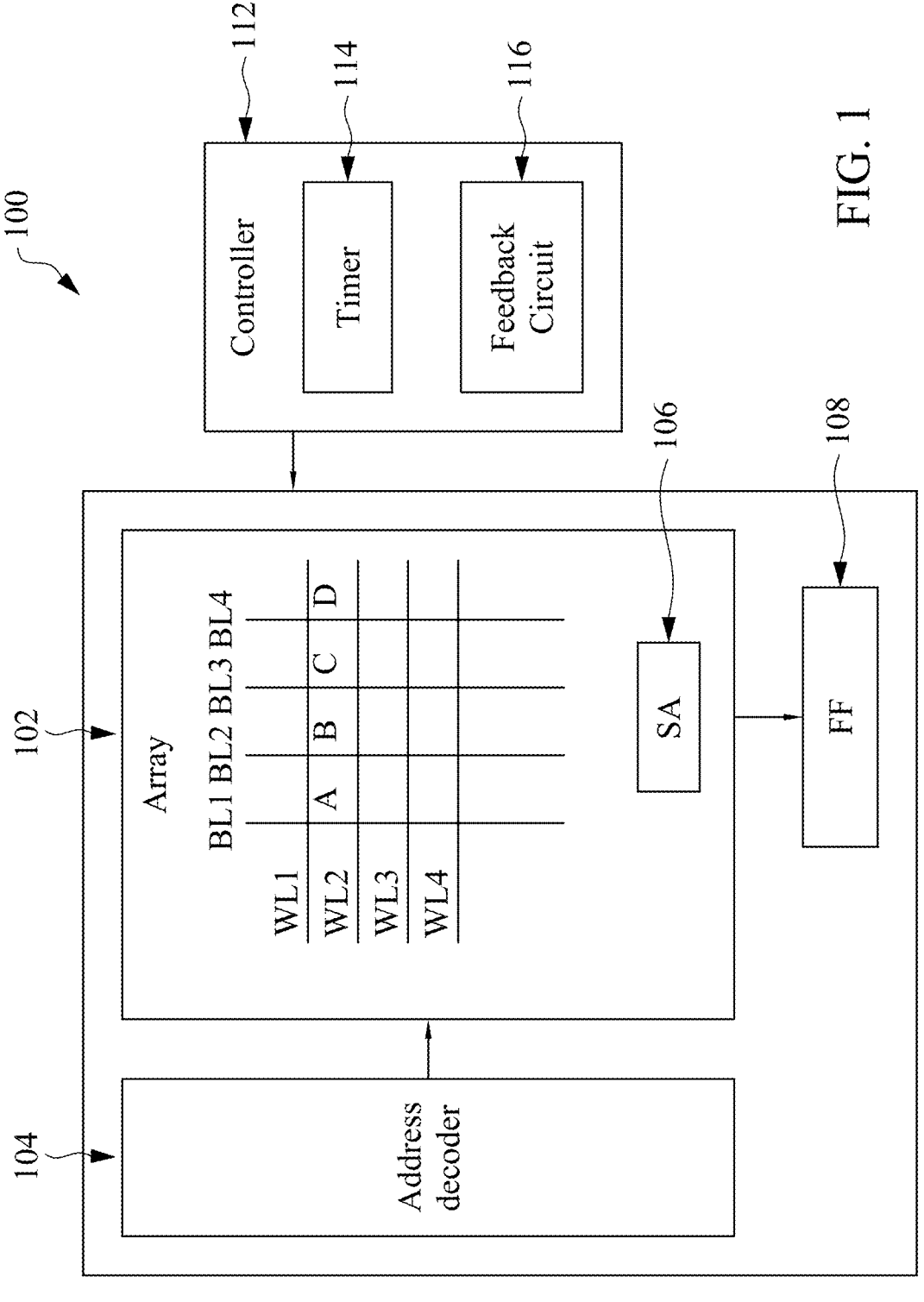
FIG. 1 is a diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices, for example, Dynamic Random Access Memory (DRAM) devices, are used to store data in semiconductor devices and systems. The data stored in a memory device may get corrupted due to various reasons. One possible cause of the corruption is due to environmental events both internal to the memory device and outside of the memory device. There are other reasons which cause the corruption (failure) of data besides environmental events. Data errors, such as, soft errors, that are not permanent or representative of physical damage to the memory device may result from disturb errors, radiation effects, or thermal effects, among others. When a bit is corrupted, the data stored is lost resulting in a system failure or data loss.

The memory device therefore is refreshed through a memory refresh operation to maintain the accuracy of the stored information. The memory refresh operation or simply refresh operation is a process of periodically reading data from an area of the memory device, checking the data for an error, correcting the error (if detected), and rewriting the data back in the memory device. Each memory refresh cycle refreshes a succeeding area of the memory device, thus repeatedly refreshing all memory cells in consecutive cycles. Generally, while the refresh operation is occurring the memory device may not be available for read and write operations.

In one example, the frequency of the refresh operation is determined based on rate of data corruption which is dependent on a leakage current of the memory device. The leakage current can change over the life of the memory device based on a variety of factors, for example, environmental events (e.g., temperature changes), usage (i.e., ageing), manufacturing defects (i.e., corner defects), etc. Therefore, the frequency of refresh operation may need to be updated continuously or is set to match the worst conditions. Such refresh operations may lead to wastage of resources as when the refresh operation is occurring the memory device may not be available for normal read and write operation.

This disclosure provides circuits and methods to control or limit the leakage current of a memory device to a preset value. Limiting the leakage current to the preset value may result in the frequency of the refresh operation to be constant irrespective of manufacturing defects, temperature variations, or usage patterns. In addition, the disclosure provides circuits and methods to provide a pumped word line voltage for the memory device. The pumped word line voltage is closer to a maximum limit for the word line voltage for the memory device and is dependent on the preset value of the leakage current. Thus, the circuits and methods described herein obviate a need for a temperature sensor or a leakage current sensor in memory devices. In addition, the circuits and methods described herein improve read and write operations in the memory device along with the refresh operations.

FIG. 1 illustrates a memory device 100 in accordance with some embodiments.

In some examples, memory device 100 is a volatile memory device, for example, a DRAM device. However, it will be apparent to a person with ordinary skill in the art after reading this disclosure that other types of memory devices are within the scope of the disclosure. Memory device 100 can be used to store data and may require memory refresh to maintain accuracy of the stored data.

As shown in FIG. 1, memory device 100 includes a memory cell array 102, an address decoder 104, a sense amplifier 106, a flip-flop 108, and a controller 112. Controller 112 further includes a timer 114 and a feedback circuit 116. It will be apparent to a person with an ordinary skill in the art after reading this disclosure that memory device 100 can include additional components than those shown in FIG. 1. In addition, it will be apparent to a person with an ordinary skill in the art after reading this disclosure that memory device 100 can include fewer components than those shown in FIG. 1.

Memory cell array 102 includes a plurality of memory cells arranged in a matrix of a plurality of rows and a plurality of columns. For example, one megabit memory device includes a cell array having 1024 rows and 1024 columns, and, therefore, 1024×1024 memory cells. Each memory cell of the plurality of memory cells are configured to store a bit logic "0" or "1" value of data therein.

Figure 2:
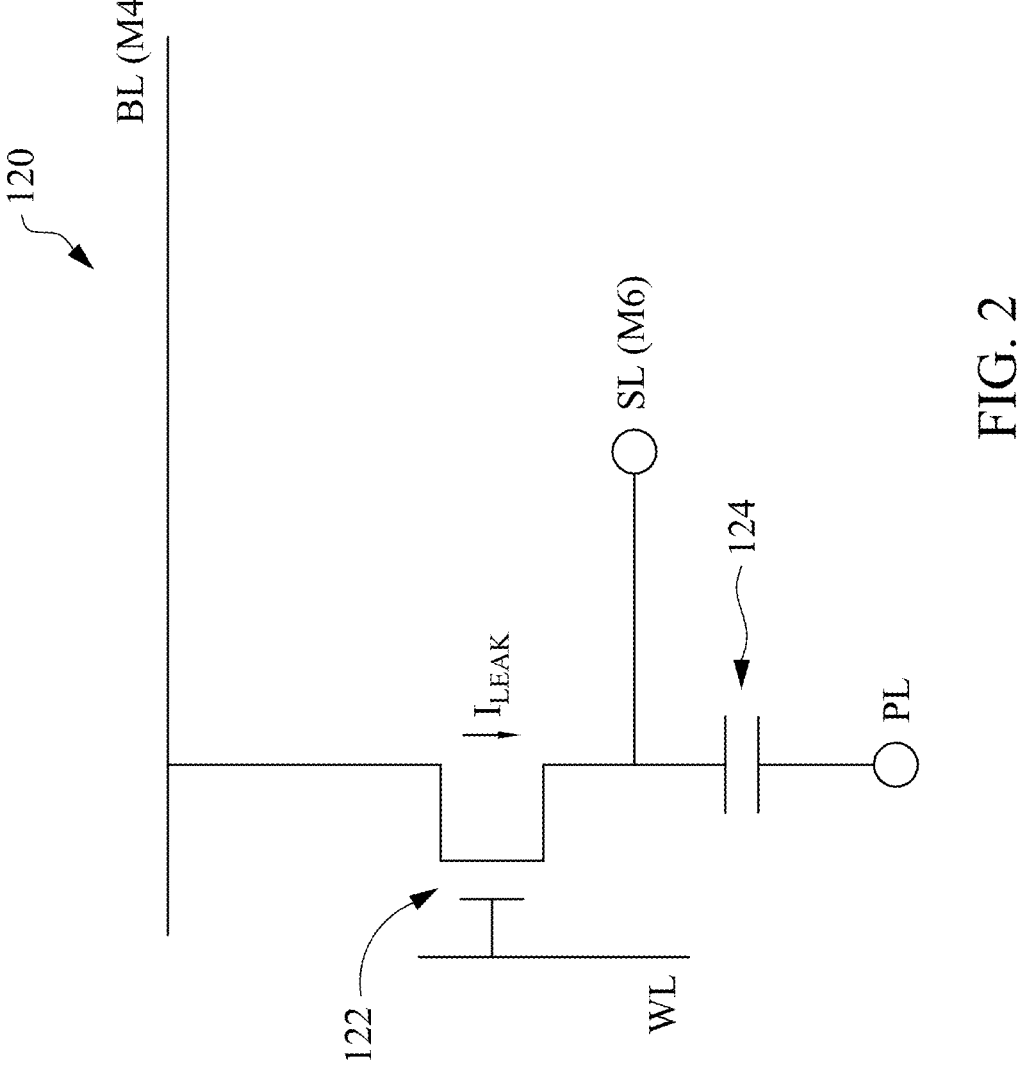
FIG. 2 is a diagram illustrating a memory cell of a memory device in accordance with some embodiments.

FIG. 2 illustrates an example memory cell 120 of memory cell array 102 of memory device 100 in accordance with some embodiments. Memory cell 120 stores one bit of information, for example, a bit value 1 and a bit value 0. As shown in FIG. 2, memory cell 120 includes an access transistor 122 and an energy storage device 124 (also referred to as a capacitor 124). A source of access transistor 122 is connected to a bit line (BL) and a drain of access transistor 122 is connected to a source line (SL) and a first terminal of capacitor 124. A second terminal of capacitor 124 is connected to a plate line (PL). A gate of access transistor 122 is connected to a word line (WL).

Since memory cell 120 includes one transistor and one capacitor, it is also referred to as 1T1C memory cell. However, other type of memory cells, for example, 1T2C, 1T2C, 2T1C, 3T1C, etc. are within the scope of the disclosure. In examples, the bit line (BL) can be formed in a metal layer four (M4) and the source line (SL) can be formed in a metal layer six (M6). However, both the bit line (BL) and the source line (SL) can be formed in different metal layers.

A charged capacitor 124 represents a bit value of 1 and a discharged capacitor 124 represents a bit value of 0. The word line (WL) controls access to capacitor 124 via access transistor 122. For example, the word line (WL) is charged to a predetermined voltage level to switch on access transistor 122 which connects the bit line (BL) to capacitor 124. The charge on capacitor 124 is measured through the bit line (BL) to determine the stored value in memory cell 120. When memory cell 120 is not being used for reading or writing data, a leakage current ($I_{LEAK}$) may flow through memory cell 120.

In examples, access transistor 122 is a n-channel Metal Oxide Semiconductor (NMOS) transistor. However, other types of transistors for example, a Complementary Metal Oxide Semiconductor (CMOS) transistor, a p-channel Metal Oxide Semiconductor (PMOS) transistor, a Field Effect Transistor (FET), Metal Oxide Semiconductor Field Effect Transistor (MOSFET), etc. In addition, access transistor 122 is symmetrical. That is, a drain of access transistor 122 can be a source and a source of access transistor 122 can be a drain.

Returning to FIG. 1, each of the plurality of rows of memory cell array 102 is associated with a word line (e.g., WL1, WL2, WL3, WL4, etc.). Moreover, each of the plurality of rows includes a first plurality of cells (cell A, cell B, cell C, cell D, etc.) of the plurality of cells. Each of the first plurality of cells of a row of the plurality of rows is connected to an associated word line (i.e., one of WL1, WL2, WL3, WL4, etc.). Similarly, each column of the plurality of columns of memory cell array 102 is associated with a bit line (i.e., BL1, BL2, BL3, BL4, etc.). Moreover, each column of the plurality of columns includes a second plurality of bit cells of the plurality of bit cells. Each of the second plurality of bit cells of a column of the plurality of columns is connected to an associated bit line (i.e., one of BL1, BL2, BL3, BL4, etc.).

Address decoder 104 is connected to memory cell array 102. Address decoder 104 is operative to select one of the plurality of word lines (that is, one of WL1, WL2, WL3, WL4, etc.) and charge the selected word line to a predetermined voltage level for read and write operations on the first plurality of cells associated with the selected word line. A single memory cell within the example one megabit memory device with 1024×1024 cells can be selected by a 10-bit row address and a 10-bit column address. In some examples, address decoder 104 is also referred to as a word line driver.

Sense amplifier 106 is connected to memory cell array 102 and is operative to read data from or write data into memory cell array 102. For example, sense amplifier 106 is operative to sense a current in a bit line and compare the sensed current with a reference current to read data from or write data into memory cell array 102. Sense amplifier 106 can be associated with a predetermined number of bit lines (for example, four bit lines, eights bit lines, etc.). The predetermined number of bit lines associated with each sense amplifier 106 is also referred to as a word. Flip-flop 108 is connected to sense amplifier 106 and is operative to temporarily store the data read from memory cell array 102 or the data to be written into memory cell array 102. Although memory device 100 of FIG. 1 is shown to include only one sense amplifier, it will be apparent to person with the ordinary skill in the art that memory device 100 can include more than one sense amplifier and flip-flop.

Controller 112 is connected to memory cell array 102 and is operative to perform refresh operations for memory cell array 102. For example, controller 112 initiates and performs refresh operation on memory cell array 102 at a set frequency. That is, controller 112 repeats the refresh operation after a predetermined time period (e.g., every 20 milliseconds, 200 milliseconds, 2 seconds, etc.) The predetermined time period or the frequency of the refresh operation is provided by timer 114.

Feedback circuit 116 provides a bias voltage to the plurality of word lines during a standby mode to limit a leakage current of memory cell array 102 to a preset value during the standby mode. Limiting the leakage current to the preset value helps in maintaining a constant frequency of the refresh operation of memory device 100. In addition, feedback circuit 116 provides a pumped word line voltage to the plurality of word lines for read and write operations. The pumped word line voltage improves read and write efficiency of memory device 100 by providing a better voltage margin for the read and write operations. Feedback circuit 116 is discussed in greater detail in the following parts of the disclosure.

Controller 112 may include a storage device to store instructions for the refresh operation and one or more processors to execute the stored instructions to perform and manage the refresh operation. The storage device to store the instructions can include a non-transistor computer readable medium.

In example embodiments, controller 112 may be in the form of a separate chip or a circuit. In one example, controller 112 is integrated with memory device 100. In another example, controller 112 is implemented on a motherboard or from an integrated memory controller (IMC) on the microprocessor to potentially reduce memory latency. Controller 112 includes, among other things, an error correcting code (ECC) circuit (not shown). The ECC circuit is configured to perform error check on data stored in memory cell array 102. For example, the ECC circuit is configured to detect and correct errors in the data stored in the plurality of cells of cell memory array 102. In some examples, the ECC circuit can include an error detection module to detect the errors and an error correction module to correct the detected errors.

In accordance with example embodiments of the disclosure, the predetermined time period or the frequency of the refresh operation is dependent on the leakage current ($I_{LEAK}$) of memory cell array 102 of memory device 100. By limiting or controlling the leakage current ($I_{LEAK}$) to a preset value, the frequency of the refresh operation for memory device 100 can be fixed. Feedback circuit 116 controls or limits the leakage current ($I_{LEAK}$) of memory device 100 to a preset value by applying a negative bias voltage (VSSN) to the plurality of word lines of memory device 100.

Figure 3:
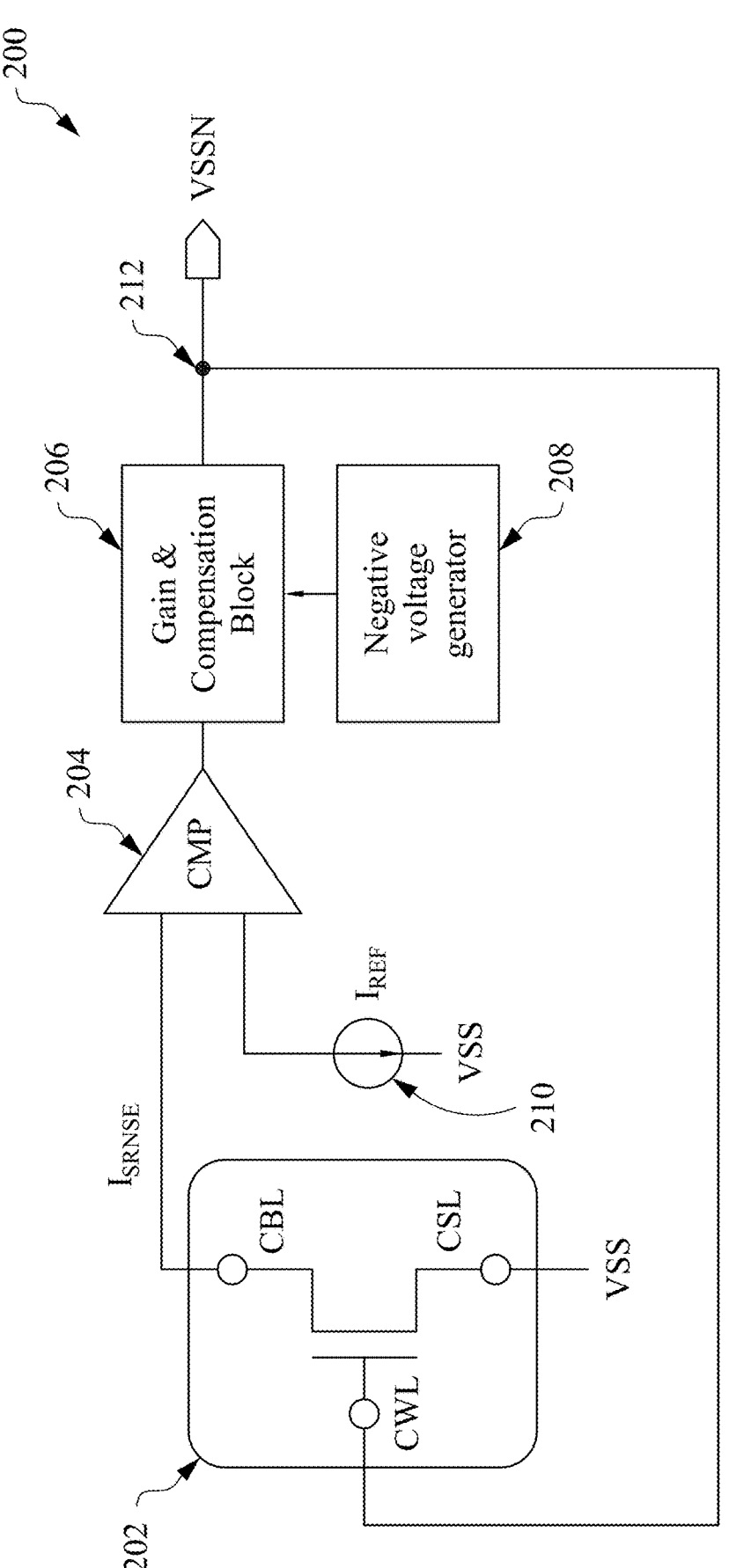
FIG. 3 is a diagram of a first feedback circuit to control a leakage current of a memory device in accordance with some embodiments.

FIG. 3 illustrates a first feedback circuit 200 to control the leakage current ($I_{LEAK}$) of memory cell array 102 of memory device 100 in accordance with some embodiments of the disclosure. First feedback circuit 200 may control the leakage current ($I_{LEAK}$) to a target value (i.e., the preset value), thus achieving a constant refresh frequency regardless of process corners, voltage variations, and operating temperatures. For example, first feedback circuit 200 provides a negative bias voltage (VSSN) that is applied to gates of the plurality of memory cells of memory cell array 102 when memory device 100 is in a standby mode. Applying the negative bias voltage (VSSN) at gates of the plurality of memory cells diminishes or limits a leakage caused by a high electric field effect in a drain junction by inhibiting creation of a depletion region underneath the gate. In addition, applying the negative bias voltage (VSSN) at gates of the plurality of memory cells diminishes dielectric leakage between a Bit Line Contact (BLC) and a Source Node Contact (SNC) by creating a greater barrier for the electrons to flow across the metal and dielectric regions. First feedback circuit 200 adjusts the negative bias voltage (VSSN) so that the leakage current ($I_{LEAK}$) of memory cell array 102 of memory device 100 is below the preset value.

As shown in FIG. 3, first feedback circuit 200 includes a reference cell array 202, a comparator 204, a gain and compensation block 206, a negative voltage generator 208, and a reference current generator 210. An output terminal of reference cell array 202 is connected to a first input terminal of comparator 204. An output terminal of reference current generator is connected to a second input terminal of comparator 204.

An output terminal of first comparator 204 is connected to a first input terminal of gain and compensation block 206.

An output terminal of negative voltage generator 208 is connected to a second input terminal of gain and compensation block 206. An output terminal of gain and compensation block 206 provides the negative bias voltage (VSSN) for the plurality of word lines of memory device 100. An input terminal of reference cell array 202 is connected to the output terminal of gain and compensation block 206 at an output node 212. Thus, reference cell array 202, first comparator 104, and gain and compensation block 206 are connected in a feedback mode or in a negative feedback mode.

Figure 4:
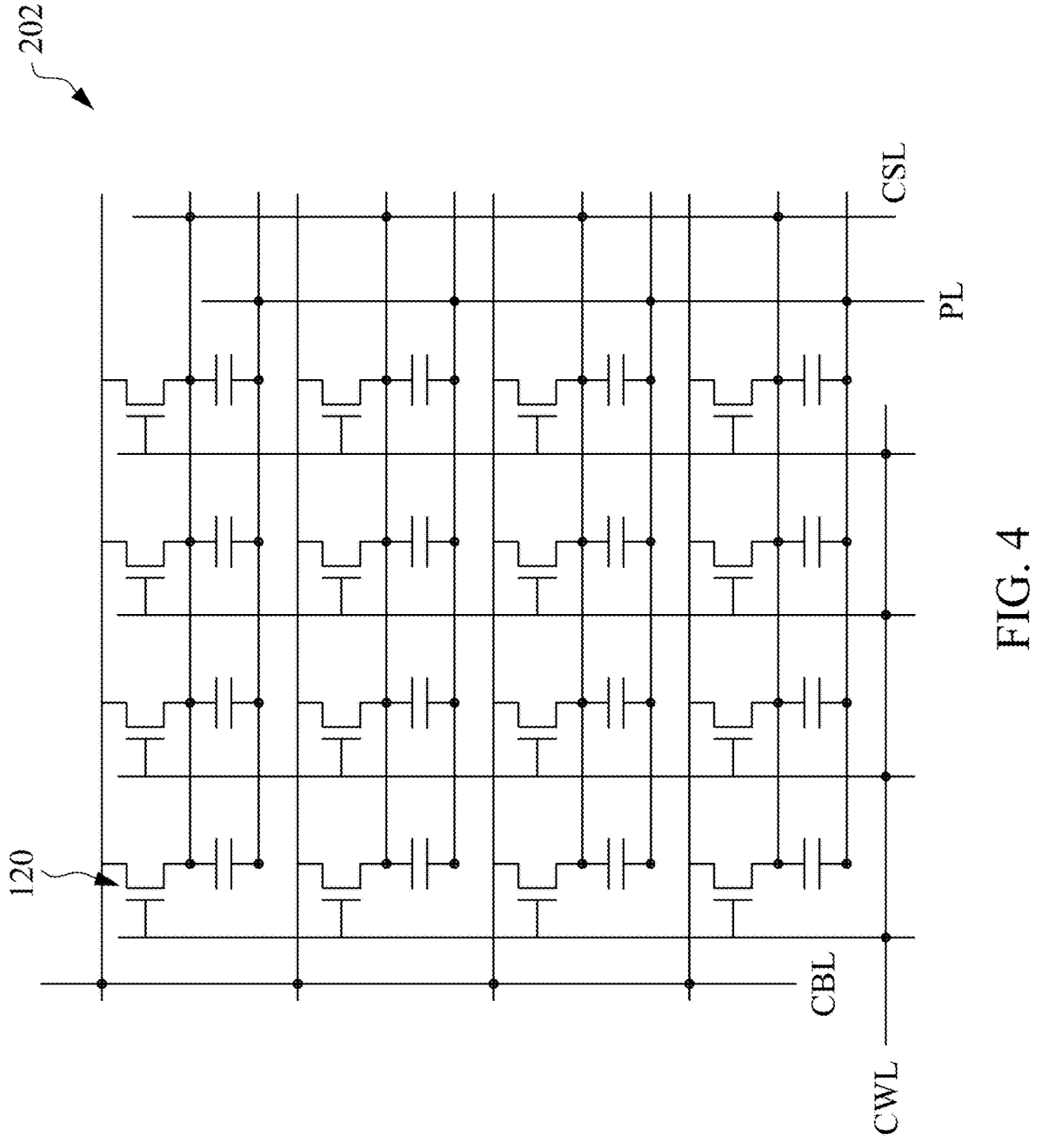
FIG. 4 is a diagram of a reference cell array of the first feedback circuit in accordance with some embodiments.

Reference cell array 202 provides a sensing current ($I_{SENSE}$) to the first input terminal of comparator 204. The sensing current ($I_{SENSE}$) is the leakage current ($I_{LEAK}$) of reference cell array 202 which is representative of the leakage current ($I_{LEAK}$) of memory cell array 102. FIG. 4 illustrates an example reference cell array 202 in accordance with some embodiments of the disclosure.

As shown in FIG. 4, reference cell array 202 includes a plurality of reference cells arranged in a matrix of a plurality of rows and a plurality of columns. The plurality of reference cells of reference cell array 202 are similar to memory cell 120 of memory cell array 102. A gate of each reference cell of reference cell array 202 in a row is connected to a word line. A source/drain of each reference cell in a row is connected to a bit line and a drain/source of each reference cell in a row is connected to a source line. In addition, plate of a capacitor of each reference cell in a row is connected to a plate line. However, all bit lines of reference cell array 202 are connected together as a one common bit line (CBL). Similarly, all word lines of reference cell array 202 are connected together as a one common word line (CWL). Moreover, all source lines of reference cell array 202 are connected together as a one common source line (CSL). Similarly, all plate lines of reference cell array 202 are connected together as a one common plate line (CPL). The sensing current ($I_{SENSE}$) is the total drain-to-source current flowing from the common bit line (CBL) to the common source line (CSL), that is, the summation of drain-to-source currents of N reference bit-cells.

Reference cell array 202 may be in a range of 100 kilo bit to 1 mega bit. However, other values are within the scope of the disclosure. In accordance with example embodiments, reference cell array 202 may include two or more reference cell sub-arrays located at different positions on a cell die. For example, one or more reference cell sub-arrays can be located at a center, edges, corners, etc. of memory cell 100. Placing the reference cell sub-arrays at different positions on the cell die may provide a better measure of the leakage current ($I_{LEAK}$) and may account for temperature variations at different positions on the cell die. In addition, placing the reference cell sub-arrays at different positions on the cell die may account for manufacturing defects at different positions on the cell die.

Returning to FIG. 3, reference current generator 210 a reference current ($I_{REF}$). The reference current ($I_{REF}$) is the preset value of the leakage current ($I_{LEAK}$) for memory cell array 102. The reference current ($I_{REF}$) is generated, for example, by dividing a bandgap reference voltage with a resistive element. The reference current ($I_{REF}$) can be constant or can be temperature compensated. For example, the reference current ($I_{REF}$) may change with change in temperature of memory device 100. Reference current generator 210 provides the reference current ($I_{REF}$) to the second input terminal of comparator 204.

Comparator 204 compares the sensing current ($I_{SENSE}$) received at the first input terminal with the reference current ($I_{REF}$) received at the second input terminal and provides an output signal at the output terminal. In examples, comparator 204 can be a digital comparator with a clock or an analog comparator without a clock. In some examples, comparator 204 can be a current or a voltage comparator. In examples, a voltage comparator can be used if both inputs are connected to resistive elements.

The output signal of comparator 204 controls negative voltage generator 208 through gain and compensation block 206. Negative voltage generator 208 provides negative bias voltage (VSSN) at an output terminal that is used to limit the leakage current ($I_{LEAK}$) of memory cell array 102. For example, when the sensing current ($I_{SENSE}$) is higher than the reference current ($I_{REF}$), gain and compensation block 206 may generate a pump enable signal (PUMP_EN) for negative voltage generator 208. Negative voltage generator 208, in response to receiving the pump enable signal (PUMP_EN), decreases the negative bias voltage (VSSN). Since, the negative bias voltage (VSSN) is applied to the gates of the plurality of memory cells of memory cell array 102, a decrease in the negative bias voltage (VSSN) decreases the leakage current ($I_{LEAK}$) of memory cell array 102. The negative bias voltage (VSSN) is lowered or decreased until the sensing current ($I_{SENSE}$) is equal to or lower than the reference current ($I_{REF}$). Thus, first feedback circuit 200 limits the leakage current ($I_{LEAK}$) in memory cell array 102 to be equal to or lower than the reference current ($I_{REF}$) (i.e., the preset value).

Figure 5:
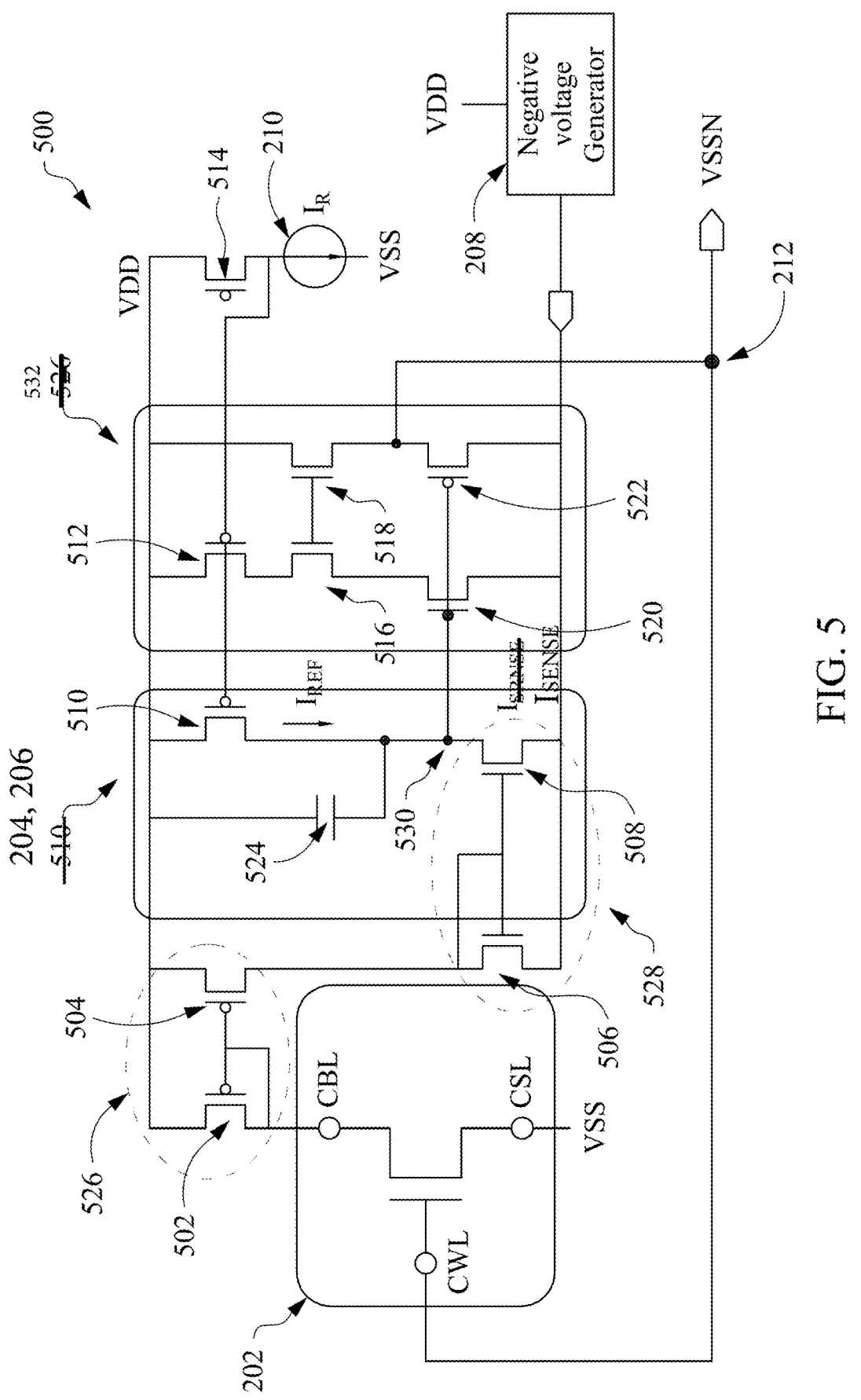
FIG. 5 is a diagram of a first example circuit diagram of the first feedback circuit in accordance with some embodiments.

FIG. 5 is a first example circuit diagram 500 of first feedback circuit 200 of FIG. 3 in accordance with some embodiments of the disclosure. Feedback circuit 200 of first circuit diagram 500 provides the negative bias voltage (VSSN) to the gates of the plurality of memory cells of memory cell array 102 of memory device 100 to limit the leakage current ($I_{LEAK}$) of memory cell array 102 to a preset value. As shown in FIG. 5, first circuit diagram 500 includes reference cell array 202, a first transistor 502, a second transistor 504, a third transistor 506, a fourth transistor 508, a fifth transistor 510, a sixth transistor 512, a seventh transistor 514, an eighth transistor 516, a ninth transistor 518, a tenth transistor 520, an eleventh transistor 522, and an energy storage element 524 (also referred to as a capacitor 524).

First transistor 502 and second transistor 504 form a first current mirror 526 that mirrors the sensing current ($I_{SENSE}$) generated by reference cell array 202. Third transistor 506 and fourth transistor 508 form a second current mirror 528 that mirrors the mirrored current provided by first current mirror 526. Second current mirror 528 provides the sensing current ($I_{SENSE}$) at a first node 530 of first circuit diagram 500. First current mirror 526 and second current mirror 528 change a direction of the sensing current ($I_{SENSE}$) from flowing into reference cell array 202 to flowing into first node 530. Gates of tenth transistor 520 and eleventh transistor 522 are connected to first node 530.

Fifth transistor 510 and seventh transistor 514 form a third current mirror that mirrors the reference current ($I_{REF}$) provided by reference current generator 210. The third current mirror provides the reference current ($I_{REF}$) at first node 530. A first terminal of capacitor 524 is connected to the supply voltage (VDD) and a second terminal of capacitor 524 is connected to first node 530. Capacitor 524 forms a dominant pole to avoid certain fluctuations in current or voltage at first node 530.

The sensing current ($I_{SENSE}$) and the reference current ($I_{REF}$) are compared at first node 530. For example, if the sensing current ($I_{SENSE}$) is greater than the reference current ($I_{REF}$), first node 530 is pulled down or decreased to a voltage level of negative voltage generator 208 (e.g., −2*VDD). This results in further lowering of the negative bias voltage (VSSN) as eleventh transistor 522 follows the voltage at its gate (i.e., first node 530) to its source that is connected to output node 212. Lowering of or decrease in the negative bias voltage (VSSN) results in decrease in the leakage current ($I_{LEAK}$) of memory cell array 102 as the negative bias voltage (VSSN) is provided to the gates of the plurality of memory cells of memory cell array 102. The negative bias voltage (VSSN) may be decreased until the sensing current ($I_{SENSE}$) is equal to or lower than the reference current ($I_{REF}$).

When the sensing current ($I_{SENSE}$) is lower than the reference current ($I_{REF}$), ninth transistor 518 may sink current into first node 530. This results in ninth transistor 518 sourcing current into reference cell array 202 and memory cell array 102. Thus, fifth transistor 510, sixth transistor 512, eighth transistor 516, ninth transistor 518, tenth transistor 520, and eleventh transistor 522 together form a push-pull buffer 532.

As shown in FIG. 5, a source of each of first transistor 502, second transistor 504, fifth transistor 510, seventh transistor 514 and ninth transistor 518 is connected to the supply voltage (VDD). A drain of each of third transistor 506, fourth transistor 508, and eleventh transistor 522 is connected to an output node of negative voltage generator 208. A drain and a gate of first transistor 502 are connected to the common bit line (CBL) of reference cell array 202. A gate of second transistor 504 is connected to the gate of first transistor 502. A drain of second transistor 504 is connected to a source and a gate of third transistor 506. A gate of fourth transistor 508 is connected to the gate of third transistor 506. A gate of each of fifth transistor 510, sixth transistor 512 and seventh transistor 514 are connected to the output terminal of reference current generator 210. A source of fourth transistor 508 is connected to first node 530. A drain of fifth transistor 510 is also connected to first node 530. In addition, a gate of each of tenth transistor 520 and eleventh transistor 522 are also connected to first node 530. A drain of sixth transistor 512 is connected to a source and a gate of eighth transistor 516. A drain of eighth transistor 516 is connected to a source of tenth transistor 520. A gate of ninth transistor 518 is connected to the gate of eighth transistor 516. A drain of ninth transistor 518 is connected to the source of eleventh transistor 522. A drain of seventh transistor is connected to the output terminal of reference current generator 210.

It will be apparent to person with skill in the art that each of first transistor 502, second transistor 504, third transistor 506, fourth transistor 508, fifth transistor 510, sixth transistor 512, seventh transistor 514, eighth transistor 516, ninth transistor 518, tenth transistor 520, and eleventh transistor 522 are symmetrical (that is, the source and the drain are interchangeable). In examples, each of first transistor 502, second transistor 504, fifth transistor 510, sixth transistor 512, seventh transistor 514, tenth transistor 520, and eleventh transistor 522 are PMOS transistors. In addition, each of third transistor 506, fourth transistor 508, eighth transistor 516, and ninth transistor 518 are NMOS transistors. However, other types of transistors are within the scope of the disclosure.

Figure 6:
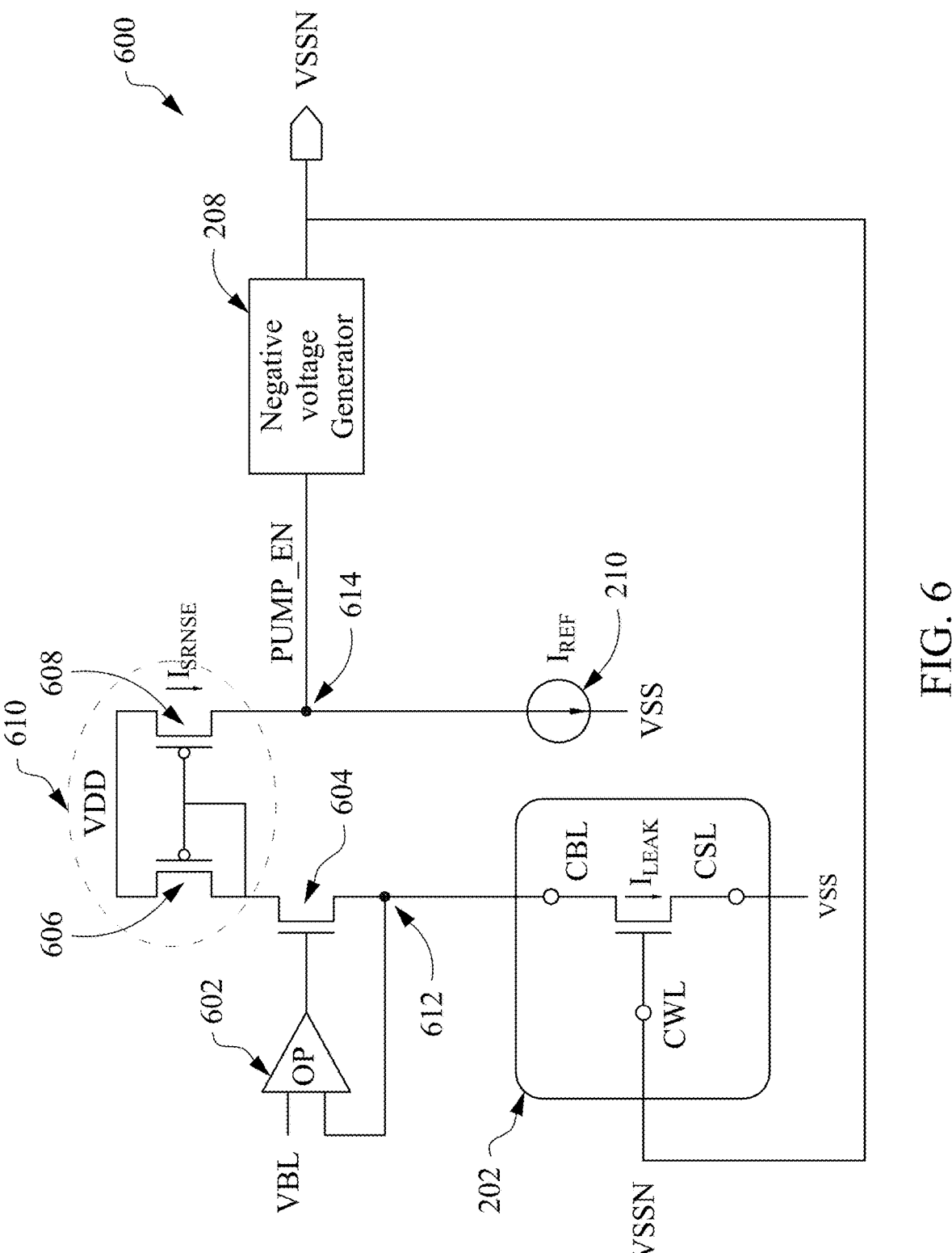
FIG. 6 is a diagram of a second example circuit diagram of the first feedback circuit in accordance with some embodiments.

FIG. 6 is a second example circuit diagram 600 of first feedback circuit 200 of FIG. 2 in accordance with some embodiments of the disclosure. Feedback circuit 200 of second circuit diagram 600 provides the negative bias voltage (VSSN) to memory cell array 102 of memory device 100 to limit the leakage current ($I_{LEAK}$) of memory cell array 102 to a preset value. As shown in FIG. 6, second circuit diagram 600 includes reference cell array 202, a comparator 602, a first transistor 604, a second transistor 606, a third transistor 608, negative voltage generator 208, and reference current source 210. Second transistor 606 and third transistor 608 form a current mirror 610.

Comparator 602 adjusts the voltage of the common bit line (CBL) of reference cell array 202 to a same voltage as that of the bit line of memory cell array 102 (i.e., the bit line voltage (VBL)). Comparator 602 is connected to the common bit line (CBL) of reference cell array 202 in a feedback mode or in a negative feedback mode. For example, a first input terminal of comparator 602 is connected to the common bit line (CBL) of reference cell array 202 at first node 612. A second input terminal of comparator 602 is connected to the bit lint voltage (VBL) node. An output terminal of comparator 602 is connected to a gate of first transistor 604. Comparator 602 and first transistor 604 together bias the common bit line (CBL) of reference cell array 202 to a same voltage as that of the bit line of memory cell array 102 (i.e., the bit line voltage (VBL)). For example, comparator 603 compares the voltage of the common bit line (CBL) of reference cell array 202 received at the first input terminal with the voltage of the bit line of memory cell array 102 received at the second input terminal, and adjusts the voltage of the common bit line (CBL) of reference cell array 202 to be equal to the voltage of the bit line (VBL) based on the comparison.

Current mirror 610 mirrors the sensing current ($I_{SENSE}$) of reference cell array 202 and provides it to second node 614. Reference current generator 210 provides the reference current ($I_{REF}$) to second node 614. The sensing current ($I_{SENSE}$) is compared with the reference current ($I_{REF}$) at second node 614 and a pump enable signal (PUMP_EN) is generated based on the comparison. The pump enable signal (PUMP_EN) activates negative voltage generator 208 to lower the negative bias voltage (VSSN). For example, if the sensing current ($I_{SENSE}$) is greater than the reference current ($I_{REF}$), then the pump enable signal (PUMP_EN) is generated to enable negative voltage generator 208 to lower the negative bias voltage (VSSN). Lowering of the negative bias voltage (VSSN) suppresses the leakage current in reference cell array 202 as well as memory cell array 102.

A gate of first transistor 604 is connected to the output terminal of comparator 602. A drain of first transistor 604 is connected to the common bit line (CBL) of reference cell array 202. A source first transistor 604 is connected to a drain of second transistor 606. A gate of second transistor 606 is connected to its drain and a gate of third transistor 608. A source of each of second transistor 606 and third transistor 608 is connected to the supply voltage (VDD). A drain of third transistor 608 is connected to second node 614. Each of first transistor 604, second transistor 606, and third transistor 608 is symmetrical. In addition, each of first transistor 604, second transistor 606, and third transistor 608 is a NMOS transistor. However, other types of transistors are within the scope of the disclosure.

Figure 7:
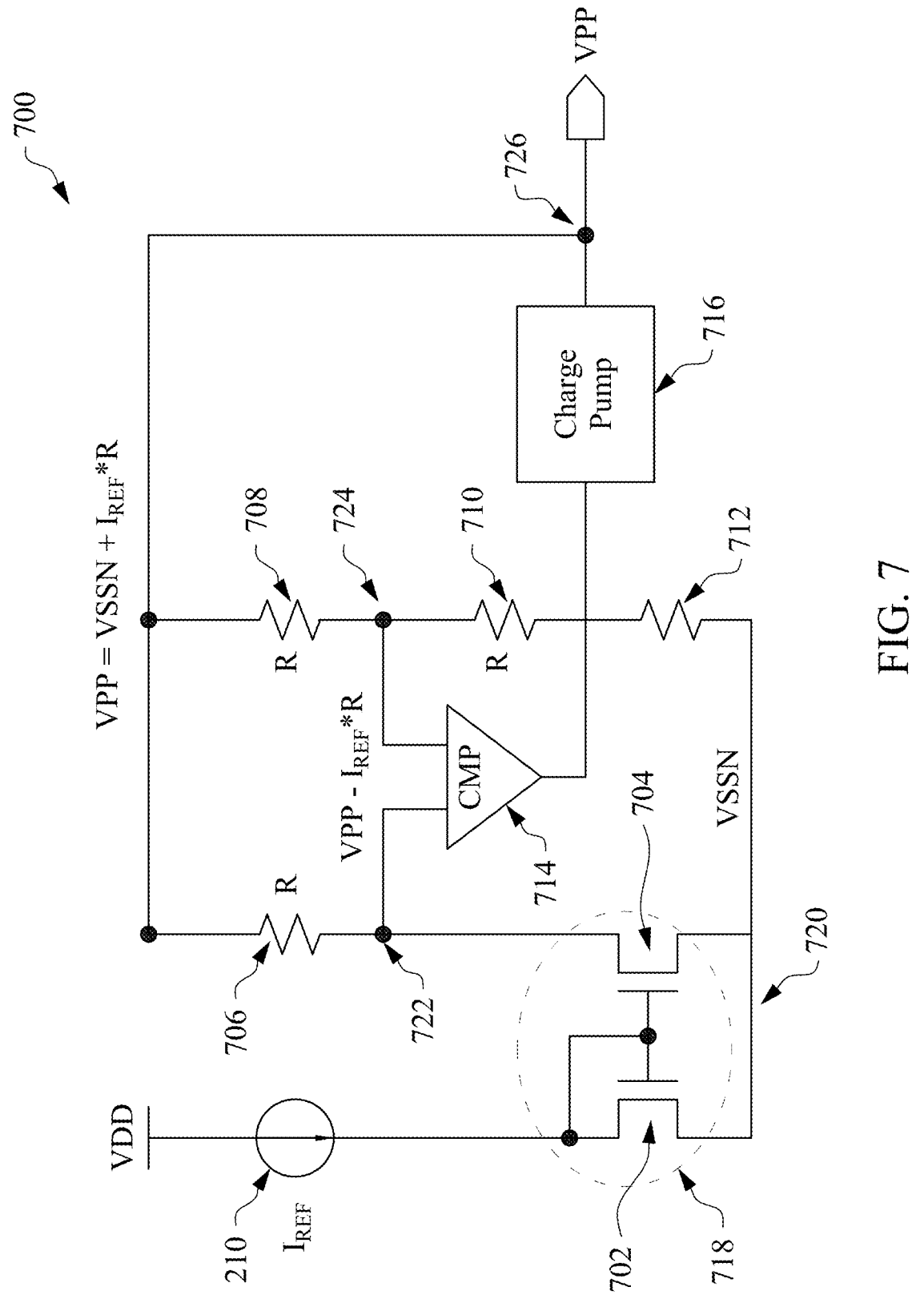
FIG. 7 is a diagram of a second feedback circuit for providing a pumped word line voltage in accordance with some embodiments.

FIG. 7 is an example circuit diagram 700 of a word line voltage generation circuit 700 in accordance with some embodiments of the disclosure. Word line voltage generation circuit 700 provides a predefined pumped word line voltage (VPP) for world lines of memory device 100 for read and write operations. The pumped word line voltage is closer to a maximum limit for the word line voltage for memory device 100 and is dependent on the preset value of the leakage current ($I_{LEAK}$). The pumped word line voltage improves read and write efficiency of memory device 100 by providing a better voltage margin between the word line voltage and the bit line voltage for the read and write operations.

As discussed in greater details in following sections of the disclosure, the pumped word line voltage (VPP) provided by word line voltage generation circuit 700 is relative to the negative bias voltage (VSSN) plus a set voltage level that is determined by the reference current ($I_{REF}$). In addition, the pumped word line voltage (VPP) is preset at a certain level above the negative bias voltage (VSSN) such that it is as close to as possible but within the tolerance limit of the maximum allowed word line voltage for memory device 100. For example, if the word line voltage (VPP) is −0.5 volts then the word line voltage (VPP) can be 1.5 volts (i.e., −0.5+2.0). This improves a voltage margin between the word line voltage and the bit line voltage for the read and write operations.

As shown in FIG. 7, word line voltage generation circuit 700 includes a first transistor 702, a second transistor 704, a first resistive element 706, a second resistive element 708, a third resistive element 710, a fourth resistive element 712, a comparator 714, and a charge pump 716. First transistor 702 and second transistor 704 form a current mirror 718. Current mirror 718 mirrors the reference current ($I_{REF}$) received from reference current source 210 and provides mirrored reference current ($I_{REF}$) to second node 722.

A first terminal of first resistive element 706 is connected to an output node 726 and a second terminal of first resistive element 706 is connected to second node 722. A first terminal of second resistive element 708 is connected to output node 726 and a second terminal of second resistive element 708 is connected to third node 724. A first terminal of third resistive element 710 is connected to third node 724 and a second terminal of third resistive element 710 is connected to a first terminal of fourth resistive element 712. A second terminal of fourth resistive element 712 is connected to first node 720. In examples, a resistance value of each of first resistive element 706, second resistive element 708, third resistive element 710, fourth resistive element 712 is same and is approximately between 100 kilo ohms to 1 mega ohms. However, other values are possible. In some other examples, third resistive element 710 and fourth resistive element 712 can be combined and provided as a single resistive element.

A first input terminal of comparator 714 is connected to second node 722 and a second input terminal of comparator 714 is connected to third node 724. An output terminal of comparator 714 is connected to charge pump 716. Thus, comparator 714 is connected in a feedback mode with charge pump 716. That is, comparator 714 compares an instantaneous voltage of second node 722 with the instantaneous voltage of the third node 724 and provides an output signal based on the comparison. The output signal from comparator 714 is provided to charge pump 716, and charge pump 716 increases or decreases the pumped word line voltage (VPP) based on the output signal.

The output signal of comparator 714 is representative of a different in voltages of second node 722 and third node 724. The instantaneous voltage of second node 722 can be represented as:

$$VPP - I_{REF} * R$$

If the instantaneous voltage of second node 722 is less than the instantaneous voltage of third node 724, charge pump 716 increases the pumped word line voltage (VPP). On contrary, if the instantaneous voltage of second node 722 is greater than the instantaneous voltage of third node 724, charge pump 716 increases the pumped word line voltage (VPP).

The pumped word line voltage (VPP) can be represented as:

$$VPP = VSSN + 3 * I_{REF} * R$$

Therefore, the pumped word line voltage (VPP) is dependent on the negative bias voltage (VSSN), the reference current ($I_{REF}$), and the resistance value of resistors 706, 708, 710 and 172. The values of the reference current ($I_{REF}$) and the resistance value of resistors 706, 708, 710 and 172 can be preset to preset the pumped world line voltage (VPPP). In addition, the reference current ($I_{REF}$) can be made temperature dependent so that the pumped word line voltage (VPP) is temperature compensated to optimize reliability requirement. In addition, the pumped word line voltage (VPP) can track the PVT variations achieving a constant stress condition to improve chip yield because of its dependency upon the reference current ($I_{REF}$).

Figure 8:
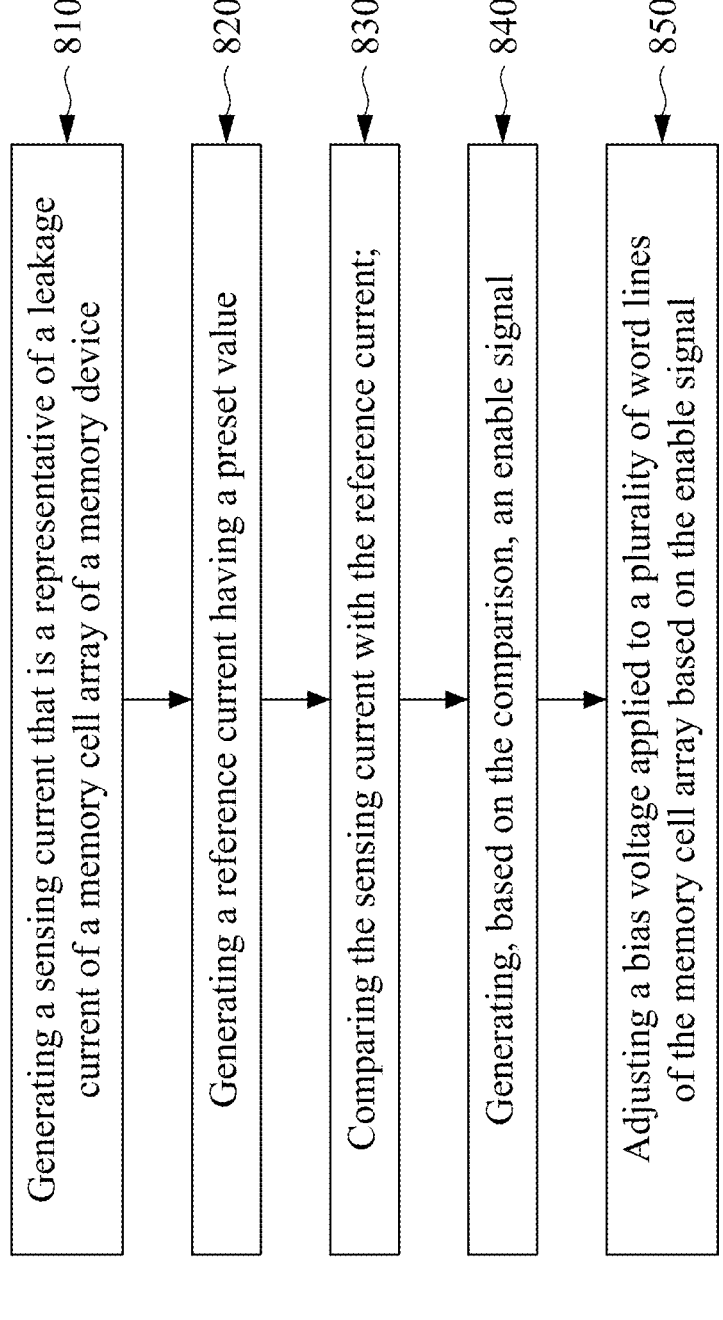
FIG. 8 is a flow diagram of a method for limiting a leakage current of a memory device in accordance with some embodiments.

FIG. 8 is a flow diagram of a method 800 for limiting a leakage current ($I_{LEAK}$) of a memory cell array 102 of memory device 100 in accordance with some embodiments. Limiting the leakage current ($I_{LEAK}$) to a preset value provides a constant frequency for refresh operations. In some examples, method 800 is performed by controller 112 or a processing system. In other examples, method 800 can be stored as instructions in a storage device accessible to controller 112 or a processor. The stored instructions can be executed by controller 112 or the processor to perform method 800. The storage device to store the instructions can include a non-transitory computer readable medium.

At block 810 of method 800 the sensing current ($I_{SENSE}$) that is a representative of the leakage current ($I_{LEAK}$) of memory cell array 102 of memory device 100 is generated. For example, and as discussed above with reference to FIGS. 1-7, the sensing current ($I_{SENSE}$) is generated through reference cell array 202. The sensing current ($I_{SENSE}$) is a summation of a drain-to-source currents of the plurality of reference cells of the reference cell array 202. Stated otherwise, the sensing current ($I_{SENSE}$) is a current flowing between the common bit line (CBL) and the common source line (CSL) of reference cell array 202.

At block 820 of method 800, the reference current ($I_{REF}$) having a preset value is generated. As discussed above, the reference current ($I_{REF}$) is generated by reference current generator 210. For example, the reference current ($I_{REF}$) is generated by dividing a bandgap reference voltage with a resistive element. The reference current ($I_{REF}$) can be constant or can be temperature compensated. The reference current ($I_{REF}$) defines a preset limit for the leakage current ($I_{LEAK}$) of memory device 100.

At block 830 of method 800, the sensing current ($I_{SENSE}$) is compared with the reference current ($I_{REF}$). For example, the sensing current ($I_{SENSE}$) is compared with the reference current ($I_{REF}$) by comparator 204 of feedback circuit 200 of FIG. 3. In addition, and as discussed above with reference to FIG. 5, the sensing current ($I_{SENSE}$) is compared with the reference current ($I_{REF}$) at first node 530 of first circuit diagram 500 of FIG. 5. Moreover, and as discussed above with reference to FIG. 6, the sensing current ($I_{SENSE}$) is compared with the reference current ($I_{REF}$) at second node 614 of second circuit diagram 600 of FIG. 6.

At block 840 of method 800, an enable signal is generated based on the comparison. For example, if the sensing current ($I_{SENSE}$) is greater than the reference current ($I_{REF}$), then the pump enable signal (PUMP_EN) is generated. In some example, the pump enable signal (PUMP_EN) is generated by gain and compensation block 206.

At block 850 of method 800, a bias voltage applied to the plurality of word lines of memory cell array 102 is adjusted based on the enable signal. For example, the pump enable signal (PUMP_EN) activates negative voltage generator 208 to lower the negative bias voltage (VSSN). For example, if the sensing current ($I_{SENSE}$) is greater than the reference current ($I_{REF}$), then the pump enable signal (PUMP_EN) is generated to enable negative voltage generator 208 to lower the negative bias voltage (VSSN). Lowering of the negative bias voltage (VSSN) suppresses the leakage current in reference cell array 202 as well as memory cell array 102.

In accordance with example embodiments, a feedback circuit for limiting a leakage current of a memory device, comprises: a reference cell array operative to generate a sensing current that is representative of a leakage current of a memory device; a reference current generator operative to generate a reference current having a preset value; a comparator operative to compare the reference current with the sensing current and provide an enable signal based on the comparison; and a negative voltage generator operative to generate a bias voltage based on the enable signal, wherein the bias voltage is applied to a plurality of word lines of the memory device in a standby mode.

In example embodiments of the disclosure, a memory device comprises: a memory cell array comprising a matrix of a plurality of rows and a plurality of columns, wherein each row of the plurality of rows comprises a first plurality of memory cells connected to a word line of a plurality of word lines, and wherein each column of the plurality of columns comprises a second plurality of memory cells connected to a bit line of a plurality of bit lines; and a first feedback circuit operative to provide a bias voltage to the plurality of word lines during a standby mode, wherein the feedback circuit limits the leakage current of the memory cell array to a preset value.

In accordance with example embodiments, a method of limiting a leakage current of a memory device, comprises: a memory device comprises: generating a sensing current that is a representative of a leakage current of a memory cell array of a memory device; generating a reference current having a preset value; comparing the sensing current with the reference current; generating, based on the comparison, a enable signal; and adjusting a bias voltage applied to a plurality of word lines of the memory cell array based on the enable signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A feedback circuit comprising:
a reference cell array connected to a memory device, wherein the reference cell array is operative to generate a sensing current that is representative of a leakage current of the memory device;
a reference current generator operative to generate a reference current having a preset value;
a comparator connected to the reference cell array and the reference current generator, wherein the comparator operative to compare the reference current with the sensing current and provide an enable signal based on the comparison; and
a negative voltage generator connected to the comparator, wherein the negative voltage generator operative to generate a bias voltage based on the enable signal, wherein the bias voltage is applied to a plurality of word lines of the memory device in a standby mode.

2. The feedback circuit of claim 1, wherein the bias voltage is also applied to a common word line of the reference cell array.

3. The feedback circuit of claim 1, wherein the bias voltage is a negative voltage and decreases when the sensing current is greater than the reference current.

4. The feedback circuit of claim 1, wherein the reference cell array comprises one or more reference cell sub-arrays placed at one or more locations on a die of the memory device.

5. The feedback circuit of claim 1, wherein the sensing current is a summation of a drain-to-source currents of a plurality of reference cells of the reference cell array.

6. The feedback circuit of claim 1, wherein a plurality of word lines of the reference cell array are connected together as one common word line, wherein a plurality of bit lines of the reference cell array are connected together as one common bit line, and wherein a plurality of source lines of the reference cell array are connected together as one common source line.

7. The feedback circuit of claim 1, wherein the negative voltage generator is a charge pump.

8. A memory device, comprising:
a memory cell array comprising a matrix of a plurality of rows and a plurality of columns, wherein each row of the plurality of rows comprises a first plurality of memory cells connected to a word line of a plurality of word lines, and wherein each column of the plurality of columns comprises a second plurality of memory cells connected to a bit line of a plurality of bit lines; and
a first feedback circuit operative to provide a bias voltage to the plurality of word lines of the memory cell array during a standby mode, wherein the feedback circuit comprises:
a reference cell array connected to the memory cell array, wherein the reference cell array generates a sensing current that is representative of a leakage current of the memory cell array device,
a comparator connected to the reference cell array, wherein the comparator compares a reference current with the sensing current and provides an enable signal based on the comparison, and a negative voltage generator connected to the comparator, wherein the negative voltage generator generates a bias voltage based on the enable signal,
wherein the bias voltage is applied to the plurality of word lines of the memory cell array in a standby mode.

9. The memory device of claim 8, wherein the first feedback circuit further comprises:
a reference current generator operative to generate the reference current having a preset value.

10. The memory device of claim 8, wherein the negative voltage generator is a charge pump.

11. The memory device of claim 8, wherein a plurality of word lines of the reference cell array are connected together as one common word line, wherein a plurality of bit lines of the reference cell array are connected together as one common bit line, and wherein a plurality of source lines of the reference cell array are connected together as one common source line.

12. The memory device of claim 8, wherein the sensing current is a summation of a drain-to-source currents of a plurality of reference cells of the reference cell array.

13. The memory device of claim 8, further comprising a second feedback circuit, wherein the second feedback circuit is operative to provide a pumped word line voltage to one of the plurality of word lines of the memory device for a read or a write operation.

14. The memory device of claim 13, wherein the pumped word line voltage is relative to the bias voltage plus a set voltage level.

15. A method of limiting a leakage current of a memory device, the method comprising:
generating, by a reference cell array connected to a memory cell array of the memory device, a sensing current that is a representative of a leakage current of the memory cell array of the memory device;
generating, by a reference current generator, a reference current having a preset value;
comparing, by a comparator connected to the reference cell array and the reference current generator, the sensing current with the reference current;
generating, by the comparator based on the comparison, an enable signal; and
adjusting, by a negative voltage generator connected to the comparator, a bias voltage applied to a plurality of word lines of the memory cell array based on the enable signal.

16. The method of claim 15, wherein generating the sensing current comprises generating the sensing current through a reference cell array.

17. The method of claim 15, wherein adjusting the bias voltage comprises decreasing the bias voltage in response to receiving the enable signal.

18. The method of claim 15, wherein generating the enable signal comprises generating the enable signal when the sensing current is greater than the reference current.

19. The method of claim 15, wherein adjusting the bias voltage applied to the plurality of word lines of the memory cell array based on the enable signal comprises decreasing the bias voltage in response to receiving the enable signal.

20. The method of claim 15, wherein the bias voltage is a negative bias voltage.

* * * * *